(12) United States Patent
Lazaro Gallego (10) Patent No.: US 9,826,644 B2
(45) Date of Patent: Nov. 21, 2017

(54) TOOL, METHOD AND MACHINE FOR MANUFACTURING MULTI-LAYER PRINTED CIRCUIT BOARDS

(71) Applicant: CHEMPLATE MATERIALS, S.L., Santa Perpetua de Mogoda, Barcelona (ES)

(72) Inventor: Victor Lazaro Gallego, Barcelona (ES)

(73) Assignee: Chemplate Materials, S.L., Barcelona (ES)

( * ) Notice: Subject to any disclaimer, the term of this patent is extended or adjusted under 35 U.S.C. 154(b) by 332 days.

(21) Appl. No.: 14/418,763

(22) PCT Filed: Jul. 24, 2013

(86) PCT No.: PCT/ES2013/070545
§ 371 (c)(1),
(2) Date: Jan. 30, 2015

(87) PCT Pub. No.: WO2014/020206
PCT Pub. Date: Feb. 6, 2014

(65) Prior Publication Data
US 2015/0223344 A1    Aug. 6, 2015

(30) Foreign Application Priority Data
Aug. 2, 2012 (EP) ..................................... 12382312

(51) Int. Cl.
*H05K 3/00* (2006.01)
*H05K 3/46* (2006.01)
(Continued)

(52) U.S. Cl.
CPC .......... *H05K 3/0097* (2013.01); *B23K 13/01* (2013.01); *H05K 3/4638* (2013.01);
(Continued)

(58) Field of Classification Search
CPC .............. H05K 3/0097; H05K 3/4638; H05K 13/0069; H05K 2203/0165; H05K 2203/101; B23K 13/01; Y10T 29/53265
(Continued)

(56) References Cited

U.S. PATENT DOCUMENTS

| 3,835,531 A | 9/1974 | Luttmer | |
|---|---|---|---|
| 6,500,529 B1 * | 12/2002 | McCarthy | H05K 1/034 174/258 |
| 2008/0079461 A1 * | 4/2008 | Lin | H01L 21/76816 326/80 |

FOREIGN PATENT DOCUMENTS

| EP | 1 460 890 A1 | 9/2004 | |
|---|---|---|---|
| FR | 0891862 A1 * | 1/1999 | ......... B29C 65/3656 |

(Continued)

OTHER PUBLICATIONS

European Search Report for EP 12 38 2312 dated Feb. 7, 2013.
International Search Report for PCT/ES2013/070545 dated Dec. 9, 2013.

*Primary Examiner* — Quang Van
(74) *Attorney, Agent, or Firm* — Sughrue Mion, PLLC (57) ABSTRACT

A tool for supporting multilayer printed circuit boards during manufacture having a frame in which there is fixed a pretensed, non-electrically conductive fabric which has a thickness less than 0.1 mm and which can be accessed by its two faces. The tool allows the induction bonding of the layers at internal points of the bundle following a method in which the bundle is placed on the tool and at least one of the welding electrodes used in the welding operation is applied on the lower face of a fabric of the tool supporting the bundle. A machine especially suitable for putting the method into practice includes C-shaped magnetic cores, the arms of which are long enough to reach the internal points of the bundle.

20 Claims, 7 Drawing Sheets

(51) Int. Cl.
*B23K 13/01* (2006.01)
*H05K 13/00* (2006.01)

(52) U.S. Cl.
CPC . *H05K 13/0069* (2013.01); *H05K 2203/0165* (2013.01); *H05K 2203/101* (2013.01); *Y10T 29/53265* (2015.01)

(58) Field of Classification Search
USPC ....... 219/617, 618, 633, 642, 659, 660, 661, 219/671, 676, 677, 675; 428/209, 297.4, 428/323, 344; 326/180, 101; 156/273.7, 156/275.3, 275.7, 291, 397.6, 498, 583.6; 29/760, 843
See application file for complete search history.

(56) References Cited

FOREIGN PATENT DOCUMENTS

| | | |
|---|---|---|
| JP | 9-29918 A | 2/1997 |
| JP | 2010-114270 A | 5/2010 |
| WO | 2008/028005 A2 | 3/2008 |
| WO | 2009/063515 A1 | 5/2009 |

\* cited by examiner

TOOL, METHOD AND MACHINE FOR MANUFACTURING MULTI-LAYER PRINTED CIRCUIT BOARDS

CROSS REFERENCE TO RELATED APPLICATIONS

This application is a National Stage of International Application No. PCT/ES2013/070545 filed Jul. 24, 2013, claiming priority based on European Patent Application No. 12382312.2 filed Aug. 2, 2012, the contents of all of which are incorporated herein by reference in their entirety.

TECHNICAL FIELD OF THE INVENTION

Stacking different layers of a circuit and bonding them to one another to form a single bundle from which the final circuit is obtained or producing a final circuit when conveniently bound and connected to another or to other juxtaposed bundles is essential in multilayer printed circuit board manufacture. The invention offers a tool especially suitable for carrying out this operation of bonding layers of a circuit board using to that end induction welding technology. The invention also relates to a method involving this tool and to a machine incorporating the tool.

BACKGROUND OF THE INVENTION

Patent document EP 1460890 discloses the technique of bonding layers of a multilayer printed circuit board to one another by means of induction. To that end, the sheets making up the layers containing a circuit image are provided with a perimetral reserve area without a circuit image but provided with several turns in short-circuit or metal spots which are superimposed when these layers containing a circuit image are stacked with resin layer interposition to form a bundle. The bonding method comprises the step of generating a magnetic field traversing the bundle precisely through said turns or spots, electric currents being induced therein which due to the Joule effect generate enough heat to melt the resin layers in the adjacent areas, which layers set upon polymerization and cause the irreversible bond between the layers containing a circuit image.

In the scope of the invention, multilayer printed circuit boards are increasingly complex in line with the growing requirement for quality and compactness and this generates new needs that did not exist until now. Such is the case of multilayer printed circuit boards having a high internal layer interconnection density, and especially those combining rigid circuit areas with flexible areas which require using sheets of the order of microns thick and materials which do not have a predictable mechanical expansion or shrinkage behavior. This causes misalignments to occur between the rigid internal layers and the flexible layers once the bundle is formed during its handling in subsequent manufacturing operations, causing a high level of rejection or of defective material.

To solve these drawbacks, welding anchors or bonds are considered for use between the layers of the circuit at non-peripheral points of the sheets, i.e., outside the reserve area mentioned above. In short, it is desirable to be able to provide the layers with suitable inner areas to enable induction welding said layers in order to anchor all the internal rigid and flexible layers of a circuit for controlling or for making the expansion and/or shrinkage movement of said layers more predictable and consequently reducing the misalignment effect.

On the other hand, to perform the induction welding an upper magnetic conductor is conventionally arranged on the upper face of the formed bundle coinciding with a turn or metal spot of the upper sheet and a lower magnetic conductor is applied on the lower face of the bundle coinciding with the corresponding turn or metal spot of the lower sheet, and a magnetic field confined by said conductors traversing the bundle is generated. To perform this operation, said bundle must be set in place or supported by a tool which prevents side movements both of the bundle and of its internal layers. At the same time, this tool must be prevented from disturbing the magnetic field traversing the bundle or from being heated due to the effect of the magnetic field and become an unwanted heat source. For such purpose, the known tools formed by a single or several assembled parts have a plate shape that does not completely cover the lower face of the bundle rather said plate is provided on its periphery with recesses or openings through which the lower magnetic conductor accesses the lower face of the sheet making up the lower layer of the bundle. Said recesses or openings revealing the bundle from the underside coincide with the reserve area provided in the sheets containing a circuit image of the bundle, generally having standard dimensions such that one and the same tool can be used for manufacturing different bundles or multilayer printed circuit boards.

In contrast, if bonds are to be made between layers through internal points of the sheets making up same, custom-made tools must be made for each circuit since the turns or metal spots are housed in the sheets depending on the particular circuit images for each printed circuit board to be manufactured. In fact, the designer first designs the circuit and then selects the location of the turns or metal spots according to the space available between the circuit images in the sheets. In the event of using conventional tools, these must be provided with openings precisely in those areas in which the turns or metal spots will be located to allow applying the lower magnetic conductor on the lower face of the sheet making up the lower layer of the bundle coinciding with the mentioned turns or metal spots.

A first objective of the present invention is a versatile tool which can be used for manufacturing different multilayer printed circuit boards, which therefore serves for bonding layers through internal points thereof even when the turns or metal spots are located in each circuit or bundle at different points with respect to one and the same reference axis.

The tool must further assure high reliability, in the sense that it must offer an absolutely flat support surface for the bundle so that said bundle does not warp and its layers are completely flat during the bonding operation.

The same tool must further be suitable so as to not disturb the magnetic field confined by the magnetic conductors and so as to not heat up due to the effect of the magnetic field.

Patent document WO 2008028005 describes a machine suitable for bonding the layers of a bundle of a multilayer printed circuit board allegedly advantageous with respect to the technology described in document EP 1460890. While document EP 1460890 describes the use of welding electrode pairs assembled facing one another in respective arms of a C-shaped magnetic core and having the capacity to move towards or away from one another for applying each one on opposite faces of the bundle and confining a magnetic field traversing the bundle from one electrode to another, patent document WO 2008028005 describes the use of an E-shaped magnetic core intended to be applied on a face of the bundle for confining a magnetic field the field lines of which traverse the bundle through three areas from each of the outer legs of the E to the central leg when these are applied on a face of the bundle. According to WO 2008028005, while the bond between the arms of the C prevents the electrodes from being able to be arranged in the inner areas of the bundle by abutting with the edge of the bundle, the solution in E allows arranging the magnetic core freely on any area of the bundle, therefore allowing unlimited mechanical bonds between the layers of the bundle through any internal point. However, document WO 2008028005 does not indicate or suggest what may be the intention or what the circumstances are that make performing this bonding in inner areas be of interest.

Another objective of the present invention is a method for performing the operation of bonding the layers of a bundle of a multilayer printed circuit board which allows performing said bonding at internal points of the panels making up the mentioned layers, outside the reserve area thereof in an easy and safe manner for the circuit.

The lack of a machine especially suitable for carrying out a method encompassing the objectives defined above is also stressed.

DISCLOSURE OF THE INVENTION

According to a first aspect of the invention, a tool for supporting multilayer circuit boards during manufacture is disclosed. This tool is characterized in that it comprises a frame in which there is fixed a pretensed, non-electrically conductive fabric which has a thickness less than 0.1 mm and can be accessed by its two faces, one of them serving to support the multilayer printed circuit board and the other for supporting at least one induction electrode.

Contrary to the known trend, instead of allowing access through the tool on which the bundle of a printed circuit board being manufactured is arranged, to allow the direct contact between a magnetic conductor confining the magnetic field and the lower face of the bundle, the inventors have resolved to cover the bundle at least on the underside by means of a fabric with the claimed properties, even in the areas which may be of interest for welding the layers thereof, so that the magnetic conductor is applied on the lower face of the fabric.

On one hand, the nature of the fabric allows its stretching and pretensed arrangement in the corresponding frame, offering a completely flat surface on which the bundle will rest without warping; and on the other hand, the material selected allows it to be thin and non-conductive enough so as to not disturb the magnetic field traversing the bundle in an unwanted manner.

In one variant the tool of the invention comprises a support rack for supporting at least two frames such that the respective fabrics are co-planar.

According to a feature of this variant, the rack forms a flat continuous surface together with the fabrics of the frames for supporting the multilayer printed circuit board.

In a particularly interesting embodiment, the rack is provided with four openings for the coupling of respective frames, the frames being of the same dimensions and symmetrically arranged in the rack according to two mirror planes perpendicular to one another and to the plane of the fabrics.

According to another feature, the rack is provided with at least two centering and holding pins for centering and holding the sheets making up the layers of a multilayer printed circuit board projecting above the plane in which the fabrics are arranged.

The frames are fixed to the rack in a firm but detachable manner.

According to a preferred embodiment, the fabric is made of glass fiber coated with a film of a material with non-stick properties, which is envisaged to be polytetrafluoroethylene (PTFE) marketed under the Teflon® trademark.

Consequently, the use of a tool according to the invention for supporting a bundle of a multilayer printed circuit board during the operation of bonding the layers making up said bundle is also claimed.

According to another aspect of the invention, a method for bonding the layers making up a multilayer circuit board comprising the operation of arranging a bundle, also known as stackup, of a multilayer circuit board on a tool according to the invention such that a non-peripheral portion of the lower layer is applied on the fabric of a frame of the tool is disclosed, the method comprising the subsequent operation of induction welding the layers of the bundle at a point of the circuit located on said non-peripheral portion, an induction electrode being placed to that end on the lower face of the mentioned fabric of the tool.

In one variant, the method comprises the additional operations of applying a second tool, similar to the tool supporting the bundle, on the upper face of the upper layer of the bundle before performing the induction welding; and of induction welding the layers of the bundle, another induction electrode being placed to that end on the upper face of a fabric of this second tool.

According to another feature of the invention, the sheets containing a circuit image making up layers of the bundle are provided, outside the area of influence of the printed circuit board images but at a non-peripheral point of the sheets, with metal areas which are axially aligned or superimposed when the layers for forming the bundle are stacked.

A peripheral point of the sheet is considered to be a point provided at the disposable edge of the sheet. The width of this edge may vary but maximally reducing the area of the sheet which it occupies will always be sought, since it is a disposable part of the sheet which cannot be used for bearing a circuit image. In this periphery, the sheets are conventionally provided with reserve areas with metal turns in short-circuit or with small metal areas by way of metal buttons or metal spots for bonding the layers forming the multilayer circuit board by induction bonding. In certain fields, work is performed with a standard according to which the width of the edge does not exceed one inch, 25 mm approximately, even though it sometimes has a smaller width.

In practice, since the sheets are rectangular and the reject part of the sheets is to be maximally reduced, a point can be considered as a non-peripheral point of a sheet when there is a circuit image between the point and the closest edges of the sheet.

As one way to proceed, induction welding is carried out by means of welding electrodes which are applied on at least one of the faces of the bundle, the method comprising capturing the coordinates indicating the location of the metal areas provided on the sheets containing a circuit image from a digital data file and using said coordinates to control the movement of mechanisms transporting the electrodes for arranging said electrodes on the work surfaces in relation with these very coordinates.

According to another aspect of the invention, a machine for putting the method described above into practice which comprises a welding station with horizontal support means for a tool for supporting the bundle immediately above which means there extends an essentially parallelepiped work area; at least two C-shaped magnetic cores the arms of which are fitted with respective facing welding electrodes with the capacity to move towards or away from one another, the length of said arms being such that the electrodes of at least one of the magnetic cores can be arranged one above and another below any point of said work area without the bridge of the C-shaped magnetic cores interfering with the support means or the work area.

In a variant of interest, the machine comprises holding means for holding a second tool on the work area and in parallel with the other tool, these holding means being suitable for moving the second tool vertically between at least two positions, one of which is an upper standby position (A), elevated above the work area, and the other is a lower work position (B).

A system for putting the method into practice comprises a tool according to the invention having a general rectangular shape with length (l) and width (h), h being ≤l; a machine comprising a welding station with horizontal support means for the mentioned tool; and at least two C-shaped magnetic cores the arms of which are fitted with respective facing welding electrodes with the capacity to move towards or away from one another, the length of said arms being greater than h/2 such that the electrodes of at least one of the magnetic cores can be arranged one above and another below any point of the tool without the bridge of the C-shaped magnetic cores interfering with the support means or the tool.

DETAILED DESCRIPTION OF THE INVENTION

In the variants of the method and machine described by way of example, electrode pairs which will be aligned one above and another below a bundle of a multilayer printed circuit board and conduct or confine a magnetic field of variable intensity that will traverse said bundle are used. For these electrodes to have any arrangement so that the magnetic field can traverse the bundle through any point, the invention proposes, instead of applying the electrodes directly on the lower and upper faces of the bundle which requires a custom-made tool for each circuit design, resting the mentioned bundle on a flat and thin enough non-conductive means so as to not alter the magnetic field which must traverse the bundle and at the same time assuring that it is perfectly flat. The invention also contemplates applying the same non-conductive means on the upper face of the bundle, a sandwich being formed with said bundle in the middle, and applying the electrodes on the outer faces of said non-conductive means placed immediately below and above the bundle.

According to the invention, these means are a pretensed fabric fixed in a frame.

Figure 1:
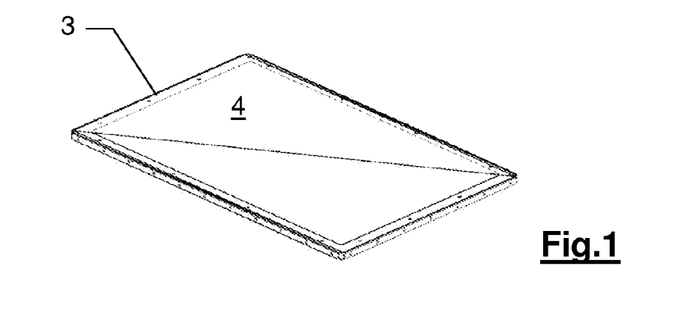
FIG. 1 shows a frame in which a pretensed, non-electrically conductive fabric is fixed.

FIG. 1 shows a frame 3 in which there is fixed a pretensed, non-electrically conductive fabric 4 having a thickness less than 0.1 mm, specifically 75 μm, suitable for serving as a support for a bundle of a multilayer printed circuit board during the operation of bonding the internal layers forming it by welding. In the example, the fabric 4 is made of glass fiber and is coated with a film of a material with non-stick properties such as Teflon®.

With respect to the material used for the fabric 4, it should be noted that non-conductive materials must be used to assure that eddy currents which generate unwanted heat at points outside the welding areas are not produced. The frame 3 should also preferably be made of a non-conductive material, although it could be an electrical conductor provided that it was somehow insulated so as to not form an electric turn in short-circuit capable of inducing currents and therefore heat.

Having fabrics thicker than that indicated would reduce the performance of the heads used for confining the magnetic field, and could as a result give rise to longer welding cycles or to the impossibility of reaching high temperatures in short periods of time.

Figure 2:
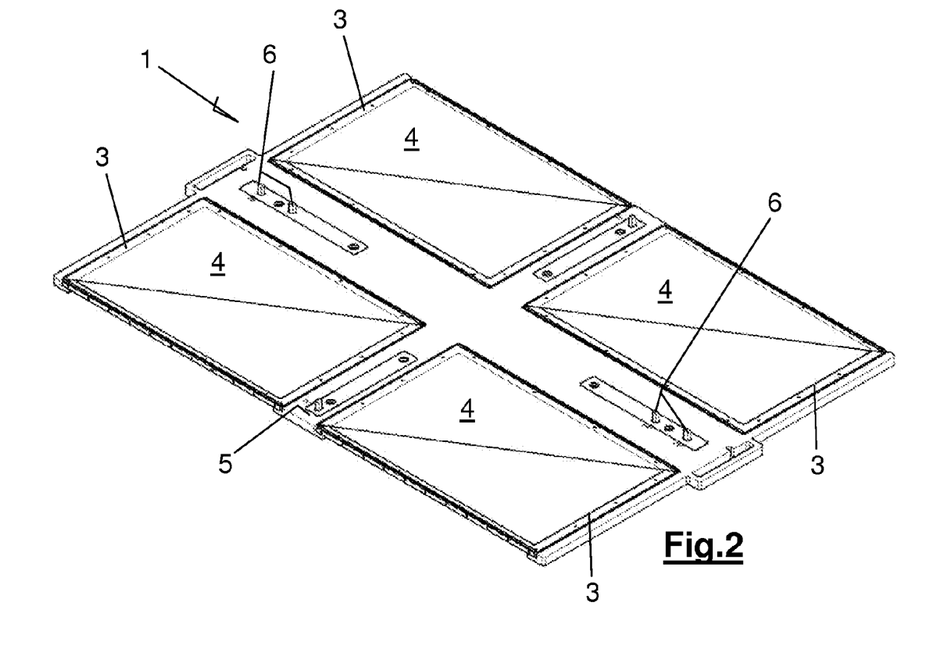
FIG. 2 shows a tool according to a first variant of the invention.

An example of a tool has been depicted in FIG. 2. The tool 1 is seen to comprise a support rack 5 for supporting four frames 3 such as that of FIG. 1, such that the respective fabrics 4 are co-planar with one another and with the upper surface of the rack 5 supporting them, such that they form a support plane for supporting the bundle of a multilayer circuit board to be manufactured. When a bundle of a multilayer printed circuit board is arranged on this tool 1, welding operations may be performed at any point of the bundle which is arranged on any one of the fabrics 4, as will be explained in further detail below.

Specifically, the rack 5 of FIG. 2 is provided with four openings for the coupling of respective frames 3, the frames being of the same dimensions and symmetrically arranged in the rack 5 according to two mirror planes perpendicular to one another and to the plane of the fabrics 4 which are accessible from the upper and lower faces of the tool 1.

Figure 3:
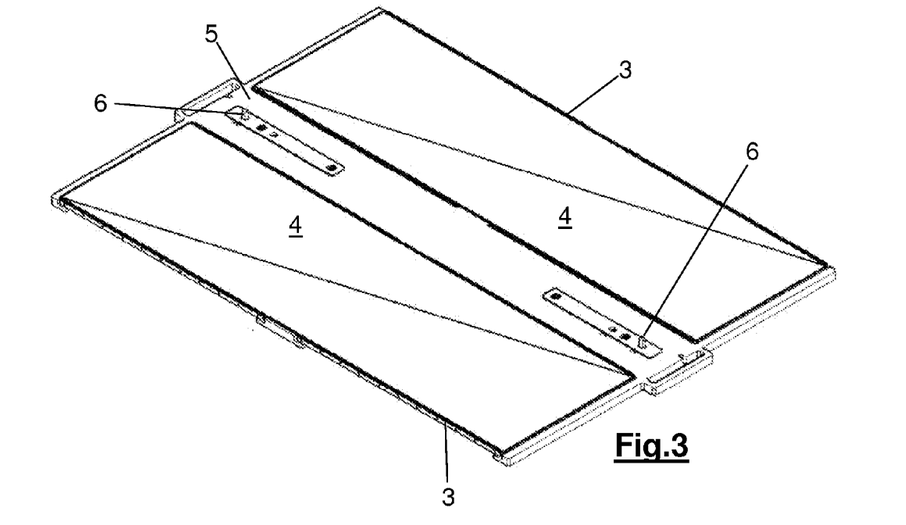
FIG. 3 shows a tool according to a second variant of the invention.
Figure 4:
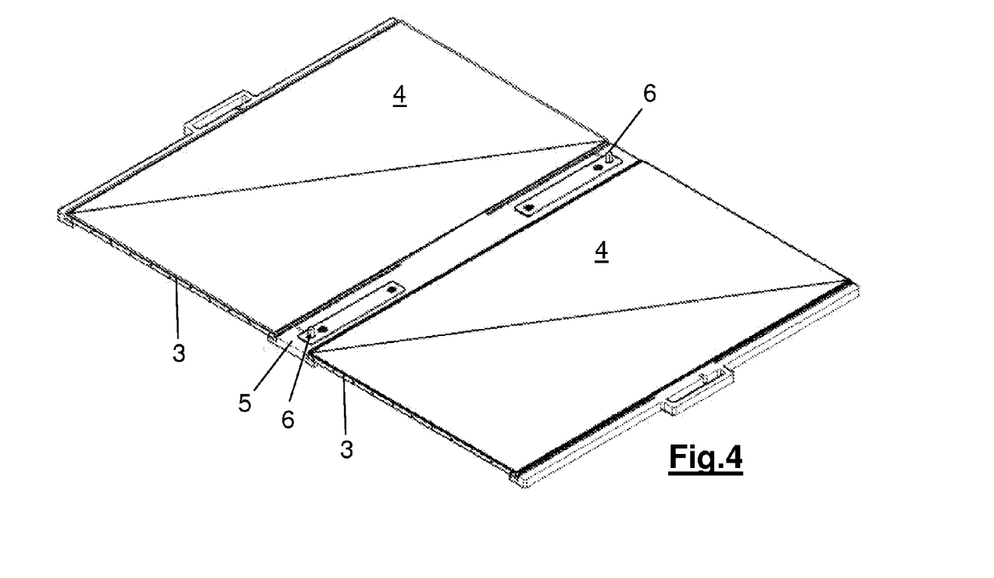
FIG. 4 shows a tool according to a third variant of the invention.

Other embodiments depicted by way of example are shown in FIGS. 3 and 4. FIGS. 3 and 4 show respective variants in which respective racks 5 are configured for supporting in both cases two identical oblong frames 3 with their respective pretensed fabrics 4: in one case following a longitudinal orientation and in another case following a rather transverse orientation.

The racks 5 can optionally be provided with centering and holding pins 6 for centering and holding the sheets making up the layers of the bundle of the multilayer printed circuit board which conventionally project above the plane in which the fabrics 4 are arranged.

Providing centering and holding pins 6 in the racks 5 would not be necessary in the event of using other solutions for centering the sheets mentioned above and holding the bundle.

Figure 5:
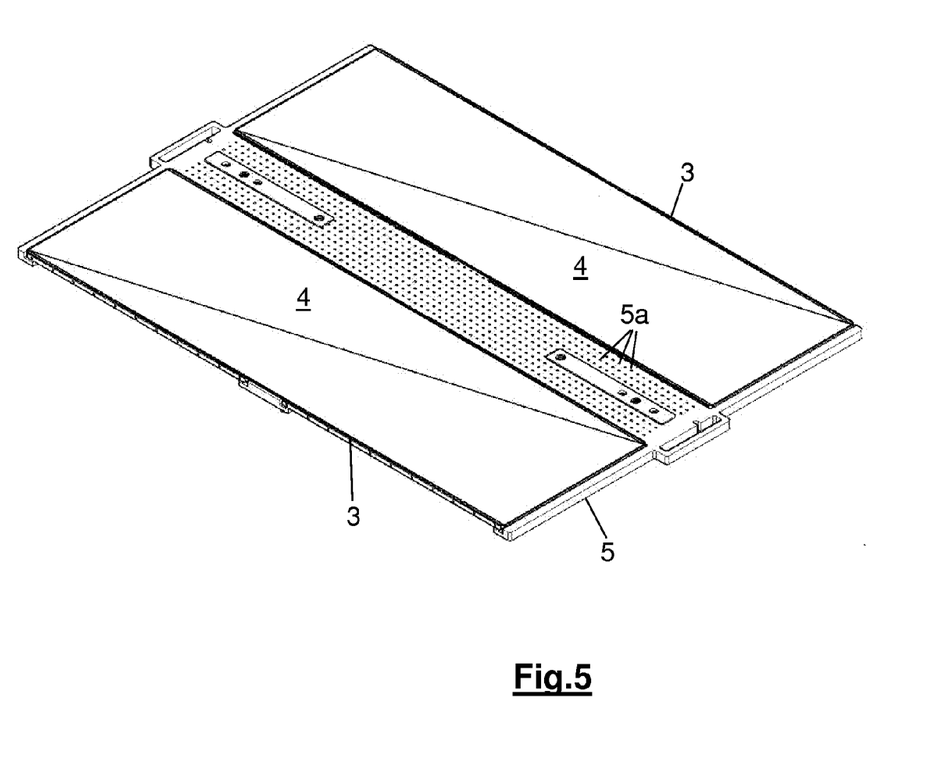
FIG. 5 shows a tool according to a fourth variant of the invention.

Therefore, the rack 5 of the tool 1 of FIG. 5 is provided, for example, with a series of perforations 5a or grooves of various shapes through which a vacuum system can act for holding the bundle arranged on the fabrics 4 of the frames 3.

The invention envisages the use of micro-porous air-permeable products to manufacture the racks 5. Since these products are naturally porous, there is no need to drill holes for vacuum clamping.

As an example, a composite material comprising different granules, such as aluminum or ceramic materials, and binders can be used for the application of the invention. In one embodiment, METAPOR® product CE 100 WHITE, a material air-permeable over the entire surface because of its micro-porous structure, can be used. The material's inherent properties eliminate the need to design and manufacture complex venting systems.

The frames 3 can be fixed on the rack 5 by means of known systems, those which allow fixing the frames 3 firmly to the rack 5 to immobilize same and prevent any relative movement between the frames 3 and the rack 5, but at the same time allowing replacing the frames 3, being preferred. Systems known in this sense include, for example, those using screws or the like.

Figure 7:
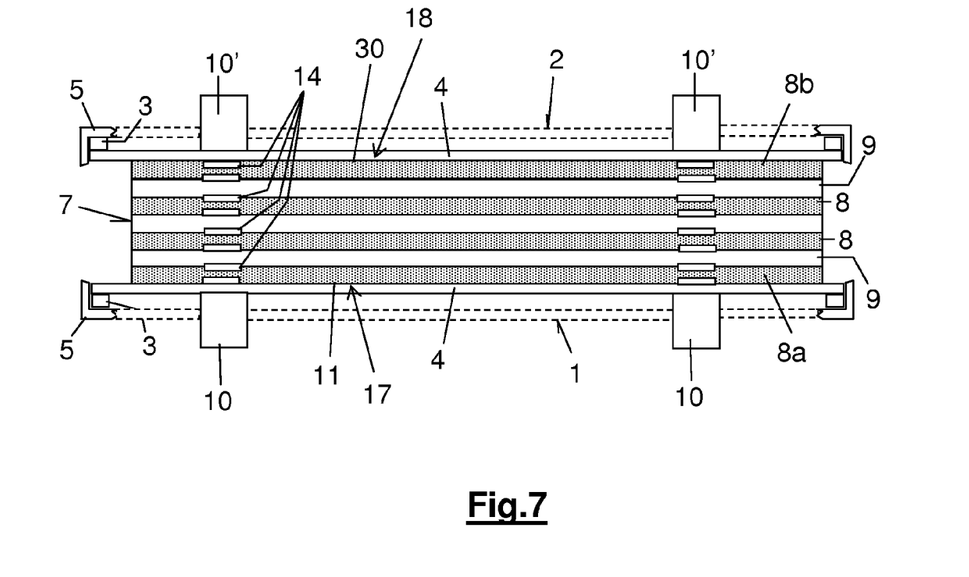
FIG. 7 is a schematic drawing showing the cross-section of a bundle placed between two tools according to the invention during an operation of welding or bonding the layers thereof.

The use of a tool 1 according to the invention allows following a method of bonding the layers of a bundle of a multilayer circuit board as explained in the following example:

FIG. 7 shows a bundle 7 made up of four layers 8 containing a circuit image stacked with interposition of insulating layers 9 without an image, for example prepreg layers (fibrous materials impregnated with reactive resin materials), intended to be melted and polymerized locally for bonding all the layers of the bundle 7 to one another.

Unlike the known bundles, the sheets 12 making up the layers 8 containing a circuit image can include metal areas 14 at internal points, i.e., not located in the periphery, for generating heat as the bundle 7 is traversed by a magnetic field of variable intensity.

Figure 6:
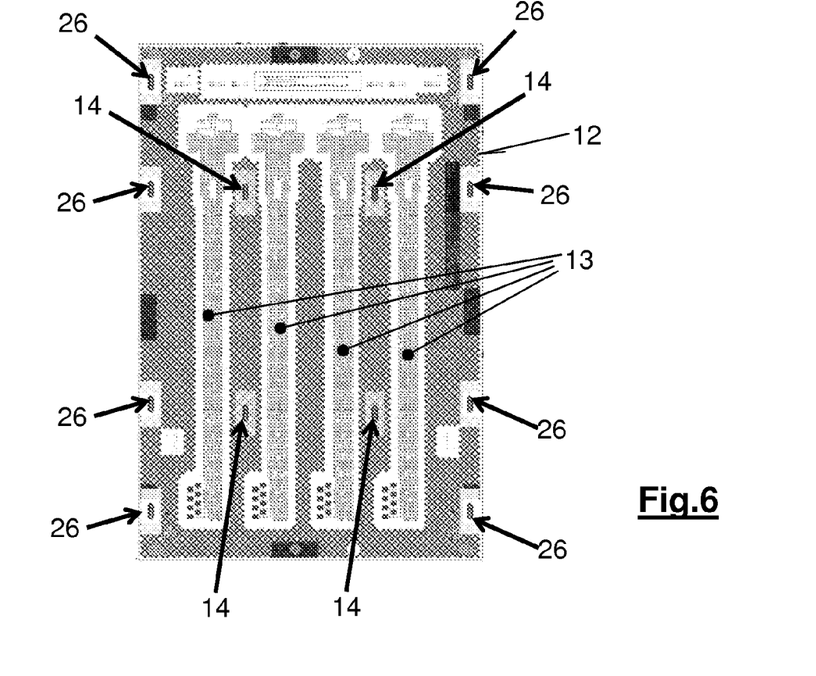
FIG. 6 illustrates the plan view of a sheet of an intermediate layer of a bundle of a multilayer printed circuit board containing a circuit image suitable for putting the method according to the invention into practice.

FIG. 6 shows what might be a sheet 12 of a layer 8 containing a circuit image 13 on both faces of the bundle 7 of FIG. 6.

This sheet 12 is provided, outside the area of influence of the printed circuit board images 13 but at a non-peripheral point of the sheet, with the metal areas 14 mentioned above which are axially aligned or superimposed when the layers 8, 9 are stacked for forming the bundle 7 as shown in FIG. 7.

In addition to these metal areas 14, the sheet 12 conventionally comprises inside the reserve area of the periphery of the sheet 12 metal areas 26 also intended for generating heat for bonding the different layers 8, 9 of the bundle 7 in peripheral areas. These metal areas 26 of the periphery have not been illustrated in FIG. 7.

Said FIG. 7 serves to illustrate a variant of the method which can be followed for bonding the layers 8, 9 making up the bundle 7 at internal points coinciding with the location of the metal areas 14. According to this variant, the bundle 7 is arranged on a first lower tool 1 such that the lower face 11 of the lower layer 8a is applied on the fabrics 4 of the frames 3 of this first tool 1, the metal areas 14 and naturally also the metal areas 26, even though they are not depicted in FIG. 6, being arranged on the vertical projection of these fabrics 4.

A second tool 2, similar to tool 1 supporting the bundle 7, is then applied on the upper face 30 of the upper layer 8b of the bundle 7 such that all the metal areas 14 will be between the fabrics 4 of both tools 1 and 2.

Induction welding can then be performed. To that end an induction electrode 10 will be placed on the lower face 17 of a fabric 4 of the tool 1 coinciding with the alignment of the metal areas 14 and another induction electrode 10' will be placed on the upper face 18 of the fabric 4 of the second tool 2 aligned with the first electrode 10. Having arranged the electrodes 10, 10' as illustrated in FIG. 7, as is already known a magnetic field of variable intensity can be generated which, confined by the electrodes 10 and 10', will traverse the bundle 7 coinciding with the areas provided with metal areas 14. Nevertheless, this magnetic field will also traverse the fabrics 4 of the tools 1 and 2 placed below and on the bundle 7, respectively.

Electric currents induced in the metal areas 14 which will discharge heat due to the Joule effect and locally heat the layers 9 for local melting and subsequent polymerization will be generated in a known manner.

In practice, since the fabrics 4 cover a very significant part of the upper and lower surfaces of the bundles, there is a great freedom for arranging the metal areas 14 required without having to replace the tool which will serve as a support for the bundle.

The invention envisages that the use of an upper tool 2 as indicated in FIG. 7 is not necessary. Nevertheless, the use of this upper tool 2 assures the flatness of the bundle 7 during the welding operation since it is pressed between the perfectly flat fabrics 4 of the upper and lower tools.

Figure 8:
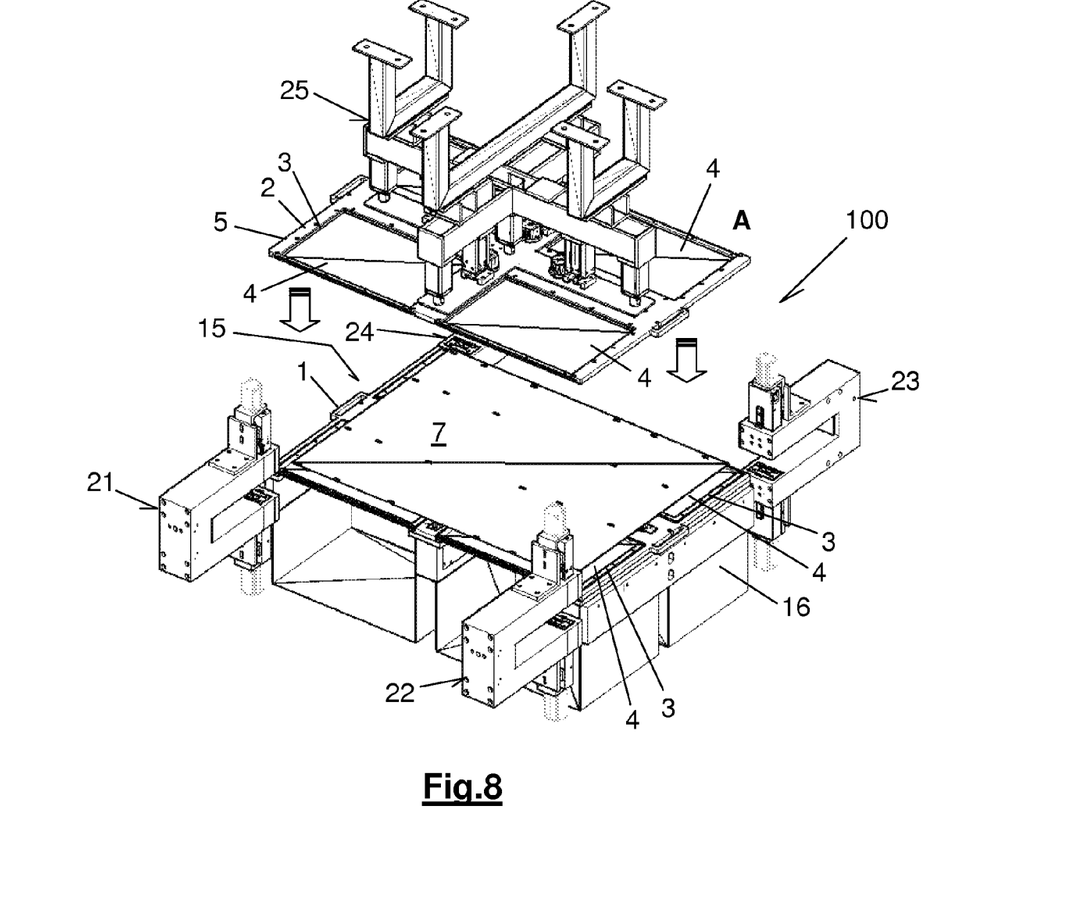
FIGS. 8 to 10 schematically show a machine according to the invention in three different instances when putting the method according to the invention into practice.
Figure 9:
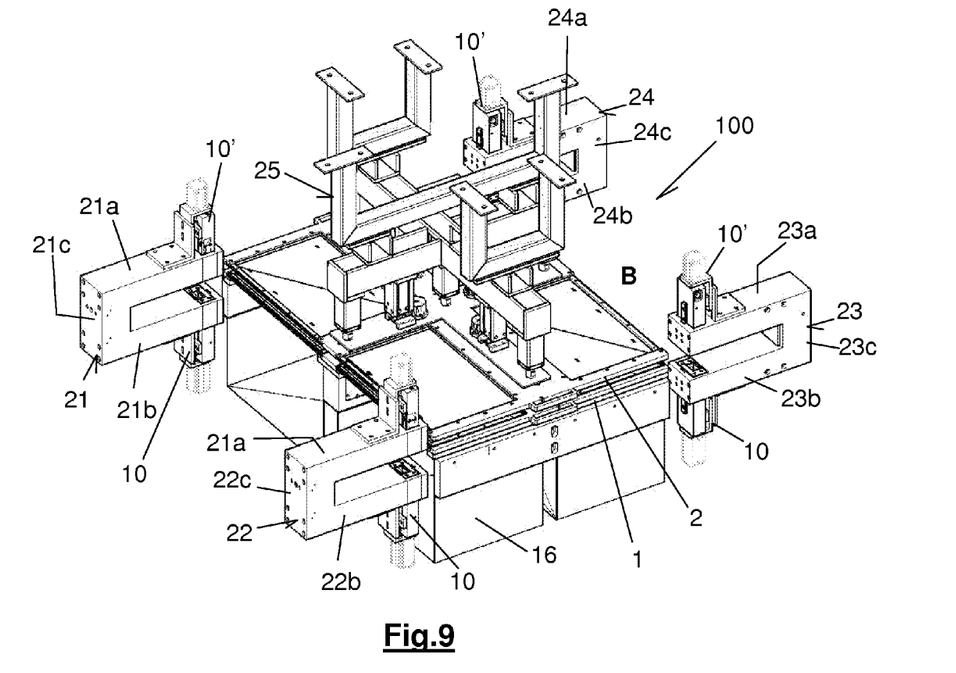
Figure 10:
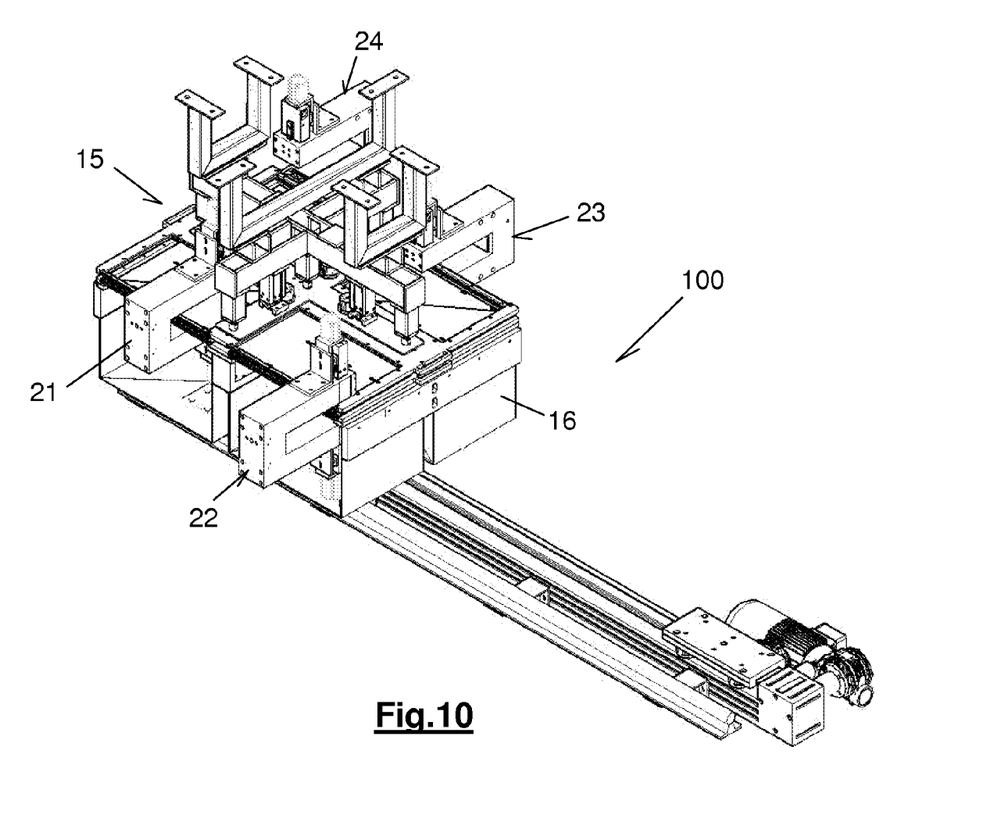

FIGS. 8 to 10 schematically show a machine 100 forming part of a system for putting the method described above into practice.

The machine 100 conventionally comprises horizontal support means 16 for a tool on which a bundle 7 which must be subjected to the induction welding operation is deposited. These support means 16 can be moved back and forth following a straight horizontal trajectory between a position in which the bundle 7 can be prepared and arranged on the tool, and another in which the tool and the bundle 7 located thereon are placed in a welding station 15 of the machine 100.

Unlike the known systems, the depicted system uses a tool 1 according to the invention. Specifically it uses a tool 1 with four frames 3 fitted with respective fabrics 4.

The machine 100 comprises four C-shaped magnetic cores 21 to 24 the arms 21a, 21b; 22a, 22b; 23a, 23b; 24a, 24b of which are fitted with respective facing welding electrodes 10, 10' (see FIG. 9) with the capacity to move towards or away from one another.

Unlike the known machines, the length of said arms is such that the electrodes 10, 10' may reach inner areas of the bundle 7 away from its periphery without the bridge 21c; 22c; 23c; 24c of the C-shaped magnetic cores interfering with the support means 16 or the tool 1.

The machine 100 further comprises holding means 25 for holding a second tool 2 similar to tool 1 on the work area and in parallel with this tool 1, these holding means 25 being suitable for moving the second tool 2 vertically between at least two positions, one of which is an upper stand-by position A, elevated above the work area and depicted in FIG. 8; and the other is a lower work position B depicted in FIGS. 9 and 10 in which the fabrics 4 of the second tool 2 are applied on the upper surface of the bundle 7.

To enable the electrodes 10 and 10' to indeed be arranged at any point of the fabrics 4, specifically the lower electrodes 10 on the lower face of the fabrics 4 of the tool 1 and the upper electrodes 10' on the upper face of the fabrics of the tool 2, said tools 1 and 2 being of length (l) and width (h), h being $\leq$l, the length of the arms of the magnetic cores is greater than h/2.

In the depicted system, the work area is divided into quadrants and each magnetic core will be supported by a respective head which may be arranged by means of a mechanism such that its electrodes reach any point of the associated quadrant, as illustrated in FIG. 10.

The invention contemplates providing the system or the machine 100 with means capable of capturing the coordinates indicating the location of the metal areas provided on the sheets containing a circuit image of the bundle 7 from a digital data file and using said coordinates to control the action of the mechanisms for arranging the heads and therefore the electrodes of the magnetic cores on the surfaces of the fabrics 4 in relation with these very coordinates.

The invention claimed is:

1. A tool for supporting multilayer printed circuit boards during manufacture, comprising a frame in which there is fixed a tensed, non-electrically conductive fabric which has a thickness less than 0.1 mm, the fabric having two accessible faces, one of the two faces serving to support a multilayer printed circuit board and the other of the two faces for contact of at least one induction electrode.

2. The tool according to claim 1, comprising a support rack for at the frame and at least one additional frame in which there is fixed a corresponding tensed, non-electrically conductive fabric, the support rack supporting the frames such that the respective fabrics are co-planar.

3. The tool according to claim 2, wherein the rack forms a flat continuous surface together with the fabrics of the frames for supporting the multilayer printed circuit board.

4. The tool according to claim 1, comprising a rack with four openings for the coupling of the frame and three additional frames, each having a respective fabric fixed therein, the four frames being of the same dimensions and symmetrically arranged in the rack according to two mirror planes perpendicular to one another and to the plane of the fabrics.

5. The tool according to claim 2, wherein the rack is provided with at least two centering pins for centering sheets making up layers of a multilayer printed circuit board projecting above a plane in which the fabrics are arranged.

6. The tool according to claim 2, wherein the frames are fixed to the rack in a firm but detachable manner.

7. The tool according to claim 1, wherein the fabric is made of glass fiber coated with a film of a material with non-stick properties.

8. The tool according to claim 2, wherein the rack is made of, or partially made of a micro-porous air-permeable material.

9. Use of a tool according to claim 1 for supporting a bundle of a multilayer printed circuit board during the operation of bonding the layers making up the bundle.

10. A method for bonding layers making up a bundle of a multilayer circuit, comprising an operation of at least partially covering one of an upper face or a lower face of the bundle by a tensed, non-conductive fabric having a thickness less than 0.1 mm and generating a magnetic field of variable intensity traversing the bundle and the fabric.

11. A method for bonding layers making up a bundle of a multilayer circuit, comprising:
providing the tool according to claim 1;
at least partially covering one of an upper face or a lower face of the bundle by the tensed, non-conductive fabric; and
generating a magnetic field of variable intensity traversing the bundle and the fabric;
wherein the bundle comprises several layers including a lower layer and an upper layer;
the method comprising the operation of arranging the bundle of the multilayer circuit on the tool such that a non-peripheral portion of a lower face of the lower layer is applied on the fabric of a frame of the tool,
the method comprising the operation of induction welding the layers of the bundle to one another in a part of the circuit located on said non-peripheral portion, with a first induction electrode being placed on the lower face of the fabric of the tool and at a location corresponding to the non-peripheral portion of the lower face of the lower layer of the bundle.

12. The method according to claim 11, comprising, before performing the induction welding, the additional operations of applying a second tool, similar to the tool supporting the bundle, on an upper face of the upper layer of the bundle; and of placing another induction electrode on the upper face of a fabric of the second tool and aligned with the first electrode.

13. The method according to claim 10, wherein the layers contain a circuit image of the bundle formed by sheets provided, outside an area of influence of the printed circuit images but at a non-peripheral point of the sheets, with metal areas which are axially aligned or superimposed when the layers are stacked for forming the bundle.

14. The method according to claim 13, comprising an operation of capturing coordinates indicating locations of the metal areas provided on the sheets containing the circuit image from a digital data file and using said coordinates to control movement of mechanisms transporting electrodes for arranging said electrodes on the work surfaces in relation with the coordinates.

15. A machine for bonding layers making up a bundle of a multilayer circuit, comprising:
the tool according to claim 1;
the bundle in which one of an upper face or a lower face of the bundle is at least partially covered by the tensed, non-conductive fabric; and
a welding station configured to generate a magnetic field of variable intensity traversing the bundle and the fabric and further comprising:
horizontal support means for the tool immediately above which means there extends an essentially parallelepiped work area;
at least two C-shaped magnetic cores having arms fitted with respective facing welding electrodes with a capacity to move towards or away from one another, the arms dimensioned such that the electrodes of at least one of the magnetic cores can be arranged one above and the other below any point of said work area without a bridge of the C-shaped magnetic cores interfering with the support means or the work area.

16. The machine according to claim 15, comprising holding means for holding a second tool on the work area and in parallel with the other tool, these holding means being suitable for moving the second tool vertically between at least two positions, one of which is an upper standby position, elevated above the work area, and the other is a lower work position.

17. A system for bonding layers making up a bundle of a multilayer circuit, comprising:
the tool according to claim 1, the tool having a general rectangular shape with length (l) and width (h), h being ≤l; and
a machine comprising a welding station with horizontal support means for the tool; and at least two C-shaped magnetic cores having arms fitted with respective facing welding electrodes with a capacity to move towards or away from one another, each arm having a length that is greater than h/2 such that the electrodes of at least one of the magnetic cores can be arranged one above and another below any point of the tool without the bridge of the C-shaped magnetic cores interfering with the support means or the tool; wherein the welding station is configured to generate a magnetic field of variable intensity traversing the bundle and the fabric.

18. The tool according to claim 7, wherein the film of material is PTFE.

19. The tool according to claim 1, wherein the tool is reusable and not a component of the multilayer printed circuit boards.

20. The method according to claim 10, wherein the fabric is a reusable tool that is not a part of the bundle of the multilayer circuit.

\* \* \* \* \*